(12) United States Patent
Huang

(10) Patent No.: US 11,329,253 B2
(45) Date of Patent: May 10, 2022

(54) MANUFACTURING METHOD OF DISPLAY ENCAPSULATION STRUCTURE BY REMOVING SACRIFICIAL LAYER TO EXPOSE TRANSPARENT COVER

(71) Applicant: Shenzhen China Star Optoelectronics Technology Co., Ltd., Guangdong (CN)

(72) Inventor: Hui Huang, Guangdong (CN)

(73) Assignee: Shenzhen China Star Optoelectronics Technology Co., Ltd., Guangdong (CN)

(*) Notice: Subject to any disclaimer, the term of this patent is extended or adjusted under 35 U.S.C. 154(b) by 295 days.

(21) Appl. No.: 16/500,712

(22) PCT Filed: Mar. 13, 2019

(86) PCT No.: PCT/CN2019/078046
§ 371 (c)(1),
(2) Date: Oct. 3, 2019

(87) PCT Pub. No.: WO2020/124815
PCT Pub. Date: Jun. 25, 2020

(65) Prior Publication Data
US 2021/0336207 A1    Oct. 28, 2021

(30) Foreign Application Priority Data
Dec. 17, 2018  (CN) .......................... 201811544013.X

(51) Int. Cl.
*H01L 51/56* (2006.01)
*H01L 51/52* (2006.01)

(52) U.S. Cl.
CPC ...... *H01L 51/5253* (2013.01); *H01L 51/5246* (2013.01); *H01L 51/5259* (2013.01); *H01L 51/56* (2013.01)

(58) Field of Classification Search
CPC ..................................................... H01L 51/56
See application file for complete search history.

(56) References Cited

U.S. PATENT DOCUMENTS

2007/0194711 A1   8/2007   Matsuura et al.
2009/0261341 A1   10/2009  Choi et al.
(Continued)

FOREIGN PATENT DOCUMENTS

| CN | 101026228 A | 8/2007 |
| CN | 103969966 A | 8/2014 |
| CN | 107104202 A | 8/2017 |

*Primary Examiner* — Michael Jung
(74) *Attorney, Agent, or Firm* — Taft Stettinius & Hollister LLP

(57) ABSTRACT

A display encapsulation structure and a manufacturing method thereof are provided. The manufacturing method includes steps of providing a sacrificial layer, a display device encapsulation structure, and a transparent cover; providing an encapsulating film layer; and removing the sacrificial layer to expose the transparent cover. The encapsulating film layer is removed from the transparent cover plate when the sacrificial layer is removed, so as to avoid affecting luminous efficiency by the encapsulating film layer, thereby improving the luminous efficiency of the display encapsulation structure.

15 Claims, 3 Drawing Sheets

(56) References Cited

U.S. PATENT DOCUMENTS

| | | | |
|---|---|---|---|
| 2009/0302760 A1* | 12/2009 | Tchakarov | B32B 17/06 |
| | | | 313/512 |
| 2016/0154268 A1* | 6/2016 | Yamazaki | H01L 51/5253 |
| | | | 349/138 |
| 2016/0268357 A1 | 9/2016 | Yamazaki et al. | |
| 2017/0123320 A1 | 5/2017 | Tian | |
| 2018/0198045 A1* | 7/2018 | Perzlmaier | H01L 33/46 |
| 2019/0043753 A1* | 2/2019 | Yokoyama | H01L 21/76826 |
| 2019/0221775 A1 | 7/2019 | Wang | |

* cited by examiner

MANUFACTURING METHOD OF DISPLAY ENCAPSULATION STRUCTURE BY REMOVING SACRIFICIAL LAYER TO EXPOSE TRANSPARENT COVER

CROSS-REFERENCE TO RELATED APPLICATIONS

This application is a U.S. National Phase of International PCT Application No. PCT/CN2019/078046 filed Mar. 13, 2019, which claims the benefit of Chinese Patent Application Serial No. 201811544013.X filed Dec. 17, 2018, the contents of each application are incorporated herein by reference in their entirety.

FIELD OF INVENTION

The present invention relates to a display encapsulation structure and a manufacturing method thereof, and more particularly, to a display encapsulation structure for improving luminous efficiency and a manufacturing method thereof.

BACKGROUND OF INVENTION

In recent years, organic light-emitting diode (OLED) flexible displays have been used in more and more products due to their flexibility, thinness, and self-illuminating properties. The existing organic light emitting diode encapsulation structures usually adapt means of thin film encapsulation. However, because the film encapsulation layer is thin, there is stress between the layers. Therefore, an ability to isolate moisture and oxygen does not achieve the desired effect.

TECHNICAL PROBLEM: In order to enhance the encapsulating effect, UV-cured sealant is added and an atomic layer deposited (ALD) film layer is formed to encapsulate the entirety, so that an interior of a display device is completely isolated from the outside environment. However, due to the deposition of the atomic layer, in addition to a contact surface with a carrier, a film layer is formed on a side surface and an upper surface of an entire panel. Therefore, the film layer is also deposited on an illuminating surface of the display panel. This portion of the film layer will have a certain influence on the appearance or luminosity of the display panel.

Therefore, it is necessary to provide a display encapsulation structure and a manufacturing method thereof to solve the problems existing in the conventional art.

SUMMARY OF INVENTION

In view of the above, the present invention provides a display encapsulation structure and a manufacturing method thereof to solve the problem that an illuminating surface of a display panel existing in the conventional art has an influence on the appearance or luminosity of the display panel due to a deposited film layer.

A main object of the present invention is to provide a display encapsulation structure and a manufacturing method thereof, which can improve the problem that an illuminating surface of a display panel has an influence on the appearance or luminosity of the display panel due to a deposited film layer.

A secondary object of the present invention is to provide a display encapsulation structure and a manufacturing method thereof, which can dispose a sacrificial layer on a transparent cover of a display panel, and when the sacrificial layer is removed, an encapsulating film layer disposed on an upper surface of the sacrificial layer is removed together, and the encapsulating film layer disposed on a side surface of the display device and a side surface of the transparent cover is remained, to prevent the encapsulating film layer from affecting luminous efficiency, thereby improving the luminous efficiency of the display encapsulation structure of the display panel.

In order to achieve the foregoing object of the present invention, an embodiment of the present invention provides a manufacturing method of a display encapsulation structure, including steps of: providing a display device encapsulation structure, the display device encapsulation structure including: a substrate; a plurality of light emitting elements disposed on the substrate; and an encapsulation layer disposed on the substrate and encapsulating the light emitting elements; disposing a sealing layer on the substrate and around the encapsulation layer; disposing a desiccating layer in a space defined between the substrate and the sealing layer, and covering the encapsulation layer; disposing a transparent cover on the encapsulation layer and the sealing layer; disposing a sacrificial layer on the transparent cover; providing an encapsulating film layer on a side surface of the display device encapsulation structure, a side surface of the transparent cover, and an upper surface of the sacrificial layer; and removing the sacrificial layer to expose the transparent cover, and remaining the encapsulating film layer on the side surface of the display device encapsulation structure and the side surface of the transparent cover.

In an embodiment of the present invention, the encapsulating film layer is continuously disposed on a first side surface of the substrate, a second side surface of the sealing layer, and a third side surface of the transparent cover, and an upper surface of the sacrificial layer; and when the sacrificial layer is removed, the encapsulating film layer disposed on the upper surface of the sacrificial layer is removed together, and the encapsulating film layer disposed on the first side surface of the substrate, the second side surface of the sealing layer, the third side surface of the transparent cover is remained.

In an embodiment of the present invention, the encapsulating film layer is formed by an atomic layer deposition process.

In an embodiment of the present invention, the sacrificial layer is a titanium dioxide film layer, and the titanium dioxide film layer is formed by a screen electrospinning process.

In an embodiment of the present invention, the titanium dioxide film layer is formed by a titanium dioxide precursor solution, the titanium dioxide precursor solution includes a solvent, an emulsifier and a dispersant, the solvent is selected from a group consisting of water, ethanol, and isopropanol; and a solid content of the titanium dioxide precursor solution ranges from 20% to 40% of a total volume of the titanium dioxide precursor solution.

In an embodiment of the present invention, the manufacturing method of the display encapsulation structure further includes steps of: applying a hydrophilic solvent to the sacrificial layer to infiltrate from an edge of an interface between the transparent cover and the sacrificial layer; and peeling off the sacrificial layer along the interface between the transparent cover and the sacrificial layer.

In an embodiment of the present invention, the transparent cover further includes a cover film layer, wherein when the sacrificial layer is peeling off along the interface between the transparent cover and the sacrificial layer, the cover film layer and the sacrificial layer are peeled off.

Moreover, another embodiment of the present invention provides a manufacturing method of a display encapsulation structure, including steps of: providing a display device encapsulation structure and a transparent cover, wherein the transparent cover is disposed on the display device encapsulation structure; disposing a sacrificial layer on the transparent cover; providing an encapsulating film layer on a side surface of the display device encapsulation structure; a side surface of the transparent cover, and an upper surface of the sacrificial layer; and removing the sacrificial layer to expose the transparent cover, and remaining the encapsulating film layer on the side surface of the display device encapsulation structure and the side surface of the transparent cover.

In an embodiment of the present invention, the display device encapsulation structure further includes: a substrate; a plurality of light emitting elements disposed on the substrate; an encapsulation layer disposed on the substrate and encapsulating the light emitting elements; a sealing layer disposed on the substrate and around the encapsulation layer, wherein the transparent cover is disposed on the encapsulation layer and the sealing layer; and a desiccating layer disposed in a space defined by the substrate, the sealing layer, and the transparent cover, and covering the encapsulation layer.

In an embodiment of the present invention, the encapsulating film layer is continuously disposed on a first side surface of the substrate; a second side surface of the sealing layer; and a third side surface of the transparent cover, and an upper surface of the sacrificial layer; and when the sacrificial layer is removed, the encapsulating film layer disposed on the upper surface of the sacrificial layer is removed together, and the encapsulating film layer disposed on the first side surface of the substrate; the second side surface of the sealing layer; the third side surface of the transparent cover is remained.

In an embodiment of the present invention, the encapsulating film layer is formed by an atomic layer deposition process.

In an embodiment of the present invention, the sacrificial layer is a titanium dioxide film layer, and the titanium dioxide film layer is formed by a screen electrospinning process.

In an embodiment of the present invention, the titanium dioxide film layer is formed by a titanium dioxide precursor solution; the titanium dioxide precursor solution includes a solvent, an emulsifier and a dispersant, the solvent is selected from a group consisting of water, ethanol, and isopropanol; and a solid content of the titanium dioxide precursor solution ranges from 20% to 40% of a total volume of the titanium dioxide precursor solution.

In an embodiment of the present invention, a thickness of the titanium dioxide film layer ranges from 5 micrometers to 10 micrometers; and a thickness of the encapsulating film layer ranges from 0.5 micrometers to 10 micrometers.

In an embodiment of the present invention, the manufacturing method of the display encapsulation structure further includes steps of: applying a hydrophilic solvent to the sacrificial layer to infiltrate from an edge of an interface between the transparent cover and the sacrificial layer; and peeling off the sacrificial layer along the interface between the transparent cover and the sacrificial layer.

In an embodiment of the present invention, the transparent cover further includes a cover film layer, wherein when the sacrificial layer is peeling off along the interface between the transparent cover and the sacrificial layer, the cover film layer and the sacrificial layer are peeled off.

Furthermore, another embodiment of the present invention further provides a display encapsulation structure manufactured by the display encapsulation structure manufacturing method as described above.

In an embodiment of the present invention, the display device encapsulation structure includes: a substrate; a plurality of light emitting elements disposed on the substrate; an encapsulation layer disposed on the substrate and encapsulating the light emitting elements; a sealing layer disposed on the substrate and around the encapsulation layer, wherein the transparent cover is disposed on the encapsulation layer and the sealing layer; and a desiccating layer disposed in a space defined by the substrate, the sealing layer, and the transparent cover, and covering the encapsulation layer.

In an embodiment of the present invention, the encapsulating film layer is continuously disposed on a first side surface of the substrate, a second side surface of the sealing layer, and a third side surface of the transparent cover.

In an embodiment of the present invention, the encapsulating film layer is not disposed on the upper surface of the transparent cover.

BENEFICIAL EFFECT: Compared with the conventional art, display encapsulation structure according to the present invention and the manufacturing method thereof can dispose a sacrificial layer on a transparent cover of a display panel, and when the sacrificial layer is removed, an encapsulating film layer disposed on an upper surface of the sacrificial layer is removed together, and the encapsulating film layer disposed on a side surface of a display device and a side surface of the transparent cover is remained. In this way, the problem that an illuminating surface of a display panel has an influence on the appearance or luminosity of the display panel due to a deposited film layer can be improved, to prevent the encapsulating film layer from affecting an luminous efficiency, thereby improving the luminous efficiency of the display encapsulation structure of the display panel.

DRAWINGS

In order to make the above description of the present invention more comprehensible, the preferred embodiments are described below, and in conjunction with the accompanying drawings, the detailed description is as follows.

DETAILED DESCRIPTION OF EMBODIMENTS

The following description of the various embodiments is provided to illustrate the specific embodiments of the invention. Furthermore, the directional terms mentioned in the present invention, such as upper, lower, top, bottom, front, rear, left, right, inner, outer, side, surrounding, central, horizontal, horizontal, vertical, longitudinal, axial, radial, uppermost or lowermost, etc., only refer to the direction of the additional schema. Therefore, the directional terminology used is for the purpose of illustration and understanding of the invention.

Figure 1:
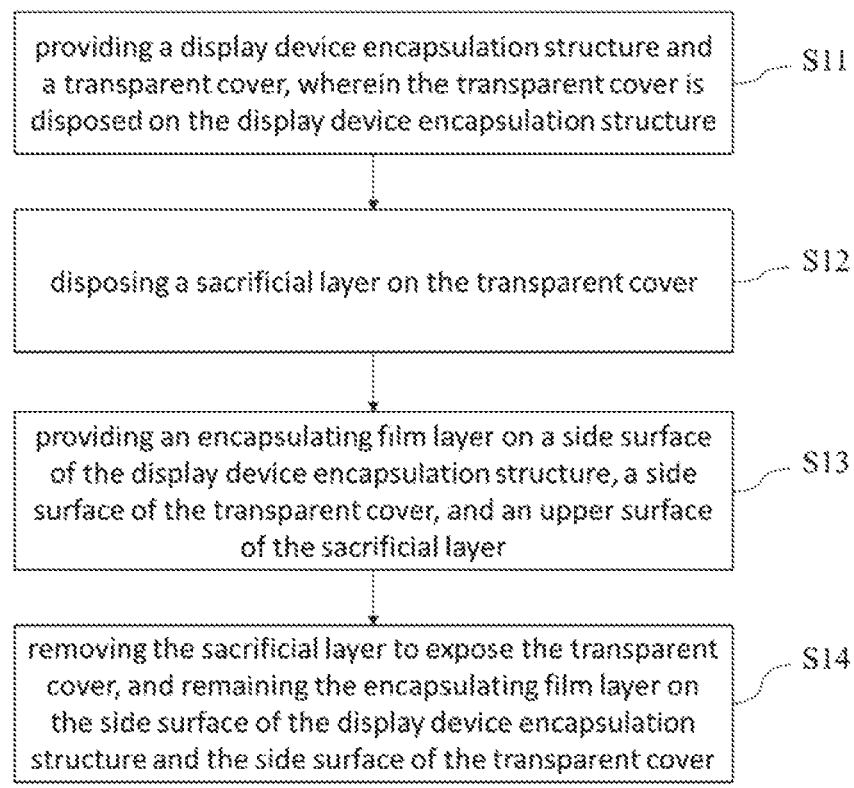
FIG. 1 is a schematic block diagram of a manufacturing method of a display encapsulation structure according to an embodiment of the present invention.

Referring to FIG. 1, an embodiment of the present invention provides a display encapsulation structure and a manufacturing method thereof. The manufacturing method of the display encapsulation structure includes the following steps: (S11) providing a display device encapsulation structure 20 and a transparent cover 21, the transparent cover 21 is disposed on the display device encapsulation structure 20; (S12) disposing a sacrificial layer 22 on the transparent cover 21; (S13) providing an encapsulating film layer 23 on a side surface of the display device encapsulation structure 20, a side surface of the transparent cover 21, and an upper surface of the sacrificial layer 22; and (S14) removing the sacrificial layer 22 to expose the transparent cover 21, and remaining the encapsulating film layer 23 on the side surface of the display device encapsulation structure 20 and the side surface of the transparent cover 21.

Figure 2A:
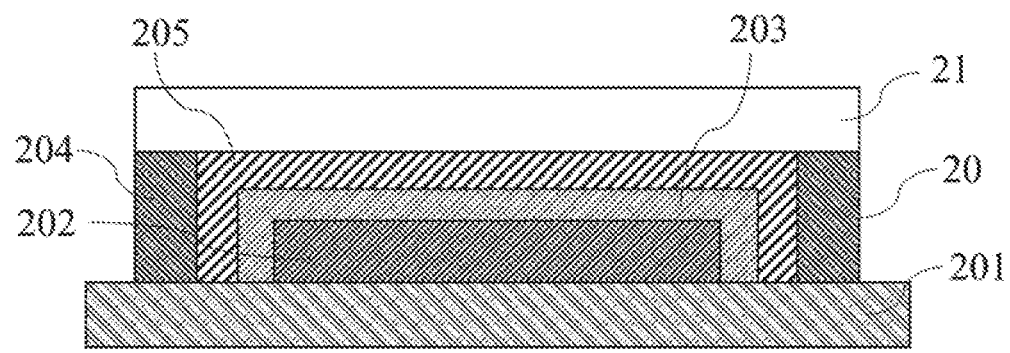
FIGS. 2A-2D are schematic process views of a display encapsulation structure according to an embodiment of the present invention.

Referring to the step S11 of FIG. 1 and FIG. 2A, a display device encapsulation structure 20 and a transparent cover 21 are provided. The transparent cover 21 is disposed on the display device encapsulation structure 20. The display device encapsulation structure 20 includes a substrate 201, a plurality of light emitting elements 202, an encapsulation layer 203, and a sealing layer 204. The light emitting elements 202 are disposed on the substrate 201. The encapsulation layer 203 is disposed on the substrate 201 and encapsulating the light emitting elements 202. The sealing layer 204 is disposed on the substrate 201 and around the encapsulation layer 203, and the transparent cover is disposed on the encapsulation layer and the sealing layer. Optionally, the display device encapsulation structure 20 further includes a desiccating layer 205 disposed in a space defined by the substrate 201, the sealing layer 204, and the transparent cover 21, and covering the encapsulation layer 203. Preferably, the substrate 201 is a flexible substrate, such as a polyimide substrate. The light emitting elements 202 are a plurality of organic light emitting diode (OLED) light emitting elements, or alternatively, a plurality of thin film transistor elements, disposed on the substrate 201. The encapsulation layer 203 may be an organic encapsulation layer, an inorganic encapsulation layer or an organic encapsulation layer and an inorganic encapsulation layer sequentially stacked, to encapsulate the light emitting elements 202, thereby blocking moisture and oxygen from impacting on the light emitting elements 202. Optionally, the sealing layer 204 may be an ultraviolet curable glue or a glass frit. Preferably, the sealing layer 204 is a sealing frame disposed in a non-display area which is around the light emitting elements 202 and surrounding the light emitting elements 202. Preferably, the desiccating layer 205 is a filling gel filling the space defined by the substrate 201, the sealing layer 204, and the transparent cover 21. A plurality of desiccant particles are disposed in the filling gel to protect the light emitting elements 202 from damage of moisture and oxygen.

Figure 2B:
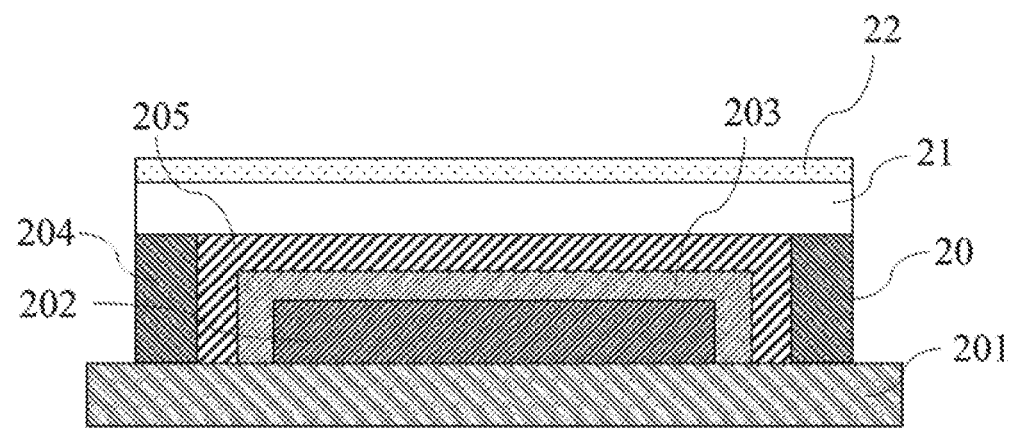

Next, referring to the step S12 of FIG. 1 and FIG. 2B, a sacrificial layer 22 is provided on the transparent cover 21. Preferably, the sacrificial layer 22 is a titanium dioxide film layer, and the titanium dioxide film layer is formed by a screen electrospinning process. Optionally, the titanium dioxide film layer is formed by a titanium dioxide precursor solution, the titanium dioxide precursor solution includes a solvent, an emulsifier, and a dispersant, the solvent may be a polar solvent. Optionally, the solvent is selected from a group consisting of water, ethanol, and isopropanol. Optionally, a solid content of the titanium dioxide precursor solution ranges from 20% to 40% of a total volume of the titanium dioxide precursor solution. Preferably, a thickness of the titanium dioxide film layer ranges from 5 micrometers to 10 micrometers. A voltage that the titanium dioxide thin film layer is formed by the screen electrospinning process ranges from 10 kV to 30 kV. Alternatively, the sacrificial layer 22 has been previously disposed on the transparent cover 21 before the transparent cover 21 is disposed on the display device encapsulation structure 20.

Figure 2C:
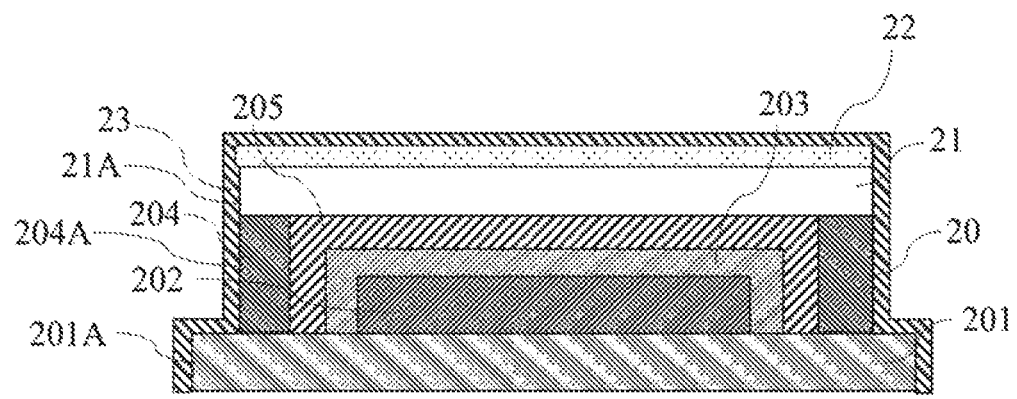

Referring to step S13 of FIG. 1 and FIG. 2C, an encapsulating film layer 23 is provided on a side surface of the display device encapsulation structure 20, a side surface of the transparent cover 21, and an upper surface of the sacrificial layer 22. The encapsulating film layer 23 is continuously disposed on a first side surface 201A of the substrate 201, a second side surface 204A of the sealing layer 204, and a third side surface 21A of the transparent cover 21, and the upper surface of the sacrificial layer 22. Preferably, a thickness of the encapsulating film layer 23 ranges from 0.5 micrometers to 10 micrometers. Optionally, the encapsulating film layer 23 is formed by an atomic layer deposition process. Optionally, material of the encapsulating film layer 23 may be aluminum oxide.

Figure 2D:
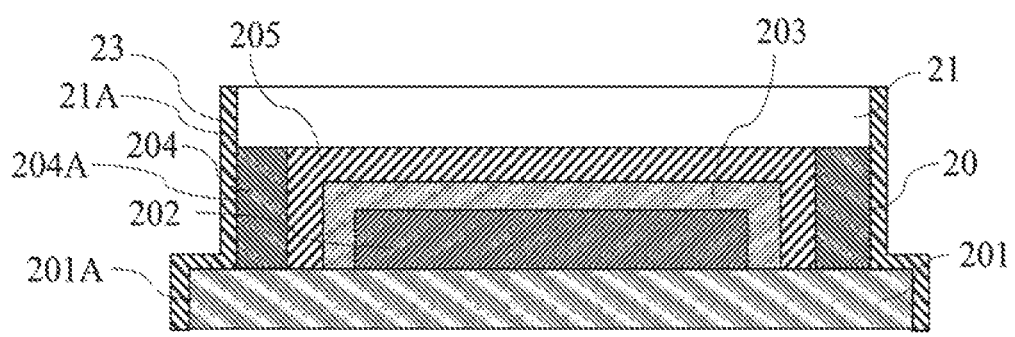

Referring to step S14 of FIG. 1 and FIG. 2D, the sacrificial layer 22 is removed to expose the transparent cover 21, and the encapsulating film layer 23 disposed on the side surface of the display device encapsulation structure 20 and the side surface of the transparent cover 21 is remained. When the sacrificial layer 22 is removed, the encapsulating film layer 23 disposed on the upper surface of the sacrificial layer 22 is removed together, and the encapsulating film layer 23 disposed on the first side surface 201A of the substrate 201, the second side surface 204A of the sealing layer 204, the third side surface 21A of the transparent cover 21 is remained. Optionally, removing the sacrificial layer 22 is to use a hydrophilic solvent to infiltrate from an edge of an interface between the transparent cover 21 and the sacrificial layer 22, and the sacrificial layer 22 is peeling off along the interface between the transparent cover 21 and the sacrificial layer 22.

Furthermore, another embodiment of the present invention further provides a display encapsulation structure, which is manufactured by the manufacturing method of the display encapsulation structure as described above. The display encapsulation structure includes: a display device encapsulation structure 20 and a transparent cover 21. The transparent cover 21 is disposed on the display device encapsulation structure 20, and an encapsulating film layer 23 is disposed on a side surface of the display device encapsulation structure 20 and a side surface of the transparent cover 21 and an upper surface of the transparent cover 21 is exposed. Optionally, the encapsulating film layer 23 is formed by an atomic layer deposition process. Optionally, a thickness of the encapsulating film layer 23 ranges from 0.5 micrometers to 10 micrometers, Optionally, the display device encapsulation structure 20 includes: a substrate 201; a plurality of light emitting elements 202 disposed on the substrate 201; an encapsulation layer 203 disposed on the substrate 201 and encapsulating the light emitting elements 202; a sealing layer 204 disposed on the substrate 201 and around the encapsulation layer 203. The transparent cover 21 is disposed on the encapsulation layer 203 and the sealing layer 204. A desiccating layer 205 disposed in a space defined by the substrate 201, the sealing layer 204, and the transparent cover 21, and covering the encapsulation layer 203. Preferably, the encapsulating film layer 23 is continuously disposed on a first side surface 201A of the substrate 201, a second side surface 204A of the sealing layer 204, and a third side surface 21A of the transparent cover 21. In particular, the encapsulating film layer 23 is not disposed on the upper surface of the transparent cover 21.

As described above, compared with an illuminating surface of an existing display panel dispose a film layer thereon, result that the film layer has an influence on the appearance or luminosity of the display panel due to a deposited film layer. A display encapsulation structure according to the present invention and a manufacturing method thereof, which can provide a sacrificial layer on a transparent cover of a display panel, and when the sacrificial layer is removed, a encapsulating film layer disposed on an upper surface of the sacrificial layer is removed together, and the encapsulating film layer disposed on a side surface of a display device and a side surface of the transparent cover is remained to prevent the encapsulating film layer from affecting luminous efficiency, but at the same time, it has the ability to block moisture and oxygen, thereby improving the luminous efficiency of the display encapsulation structure of the display panel.

The present invention has been described by the above related embodiments, but the above embodiments are merely examples for implementing the present invention. It must be noted that the disclosed embodiments do not limit the scope of the invention. Conversely, modifications and equivalent arrangements are intended to be included within the scope of the invention.

The invention claimed is:

1. A manufacturing method of a display encapsulation structure, comprising steps of:
   providing a display device encapsulation structure, the display device encapsulation structure comprising:
   a substrate;
   a plurality of light emitting elements disposed on the substrate; and
   an encapsulation layer disposed on the substrate and encapsulating the light emitting elements;
   disposing a sealing layer on the substrate and around the encapsulation layer;
   disposing a desiccating layer in a space defined between the substrate and the sealing layer, and covering the encapsulation layer;
   disposing a transparent cover on the encapsulation layer and the sealing layer;
   disposing a sacrificial layer on the transparent cover;
   providing an encapsulating film layer on a side surface of the display device encapsulation structure, a side surface of the transparent cover, and an upper surface of the sacrificial layer; and
   removing the sacrificial layer to expose the transparent cover,
   wherein after the removing step, the encapsulating film layer remains on the side surface of the display device encapsulation structure and the side surface of the transparent cover.

2. The manufacturing method of the display encapsulation structure according to claim 1, wherein the encapsulating film layer is continuously disposed on a first side surface of the substrate, a second side surface of the sealing layer, and a third side surface of the transparent cover, and an upper surface of the sacrificial layer; and
   when the sacrificial layer is removed, the encapsulating film layer disposed on the upper surface of the sacrificial layer is removed together, and the encapsulating film layer disposed on the first side surface of the substrate, the second side surface of the sealing layer, the third side surface of the transparent cover is remained.

3. The manufacturing method of the display encapsulation structure according to claim 1, wherein the encapsulating film layer is formed by an atomic layer deposition process.

4. The manufacturing method of the display encapsulation structure according to claim 1, wherein the sacrificial layer is a titanium dioxide film layer, and the titanium dioxide film layer is formed by a screen electrospinning process.

5. The manufacturing method of the display encapsulation structure according to claim 4, wherein the titanium dioxide film layer is formed by a titanium dioxide precursor solution, the titanium dioxide precursor solution comprises a solvent, an emulsifier and a dispersant, the solvent is selected from a group consisting of water, ethanol, and isopropanol; and a solid content of the titanium dioxide precursor solution ranges from 20% to 40% of a total volume of the titanium dioxide precursor solution.

6. The manufacturing method of the display encapsulation structure according to claim 1, wherein the manufacturing method of the display encapsulation structure further comprises steps of:
   applying a hydrophilic solvent to the sacrificial layer to infiltrate from an edge of an interface between the transparent cover and the sacrificial layer; and
   peeling off the sacrificial layer along the interface between the transparent cover and the sacrificial layer.

7. The manufacturing method of the display encapsulation structure according to claim 6, wherein the transparent cover further comprises a cover film layer, wherein when the sacrificial layer is peeling off along the interface between the transparent cover and the sacrificial layer, the cover film layer and the sacrificial layer are peeled off.

8. A manufacturing method of a display encapsulation structure, comprising steps of:
   providing a display device encapsulation structure and a transparent cover, wherein the transparent cover is disposed on the display device encapsulation structure;
   disposing a sacrificial layer on the transparent cover;
   providing an encapsulating film layer on a side surface of the display device encapsulation structure, a side surface of the transparent cover, and an upper surface of the sacrificial layer; and
   removing the sacrificial layer to expose the transparent cover,
   wherein after the removing step, the encapsulating film layer remains on the side surface of the display device encapsulation structure and the side surface of the transparent cover, and
   wherein the sacrificial layer is a titanium dioxide film layer, and the titanium dioxide film layer is formed by a screen electrospinning process.

9. The manufacturing method of the display encapsulation structure according to claim 8, wherein the display device encapsulation structure further comprises:
   a substrate;
   a plurality of light emitting elements disposed on the substrate;
   an encapsulation layer disposed on the substrate and encapsulating the light emitting elements;
   a sealing layer disposed on the substrate and around the encapsulation layer, wherein the transparent cover is disposed on the encapsulation layer and the sealing layer; and
   a desiccating layer disposed in a space defined by the substrate, the sealing layer, and the transparent cover, and covering the encapsulation layer.

10. The manufacturing method of the display encapsulation structure according to claim 9, wherein the encapsulating film layer is continuously disposed on a first side surface of the substrate, a second side surface of the sealing layer, and a third side surface of the transparent cover, and an upper surface of the sacrificial layer; and when the sacrificial layer is removed, the encapsulating film layer disposed on the upper surface of the sacrificial layer is removed together, and the encapsulating film layer disposed on the first side surface of the substrate, the second side surface of the sealing layer, the third side surface of the transparent cover is remained.

11. The manufacturing method of the display encapsulation structure according to claim 8, wherein the encapsulating film layer is formed by an atomic layer deposition process.

12. The manufacturing method of the display encapsulation structure according to claim 8, wherein the titanium dioxide film layer is formed by a titanium dioxide precursor solution, the titanium dioxide precursor solution comprises a solvent, an emulsifier, and a dispersant, the solvent is selected from a group consisting of water, ethanol, and isopropanol; and a solid content of the titanium dioxide precursor solution ranges from 20% to 40% of a total volume of the titanium dioxide precursor solution.

13. The manufacturing method of the display encapsulation structure according to claim 8, wherein a thickness of the titanium dioxide film layer ranges from 5 micrometers to 10 micrometers, and a thickness of the encapsulating film layer ranges from 0.5 micrometers to 10 micrometers.

14. The manufacturing method of the display encapsulation structure according to claim 8, wherein the manufacturing method of the display encapsulation structure further comprises steps of:

applying a hydrophilic solvent to the sacrificial layer to infiltrate from an edge of an interface between the transparent cover and the sacrificial layer; and peeling off the sacrificial layer along the interface between the transparent cover and the sacrificial layer.

15. The manufacturing method of the display encapsulation structure according to claim 14, wherein the transparent cover further comprises a cover film layer, wherein when the sacrificial layer is peeling off along the interface between the transparent cover and the sacrificial layer, the cover film layer and the sacrificial layer are peeled off.

\* \* \* \* \*